US011932498B2

(12) United States Patent
Ouyang et al.

(10) Patent No.: US 11,932,498 B2
(45) Date of Patent: Mar. 19, 2024

(54) TEMPERATURE CONTROL AND METHOD FOR DEVICES UNDER TEST AND IMAGE SENSOR-TESTING APPARATUS HAVING THE SYSTEM

(71) Applicant: CHROMA ATE INC., Taoyuan (TW)

(72) Inventors: Chin-Yi Ouyang, Taoyuan (TW); Chin-Yuan Kuo, Taoyuan (TW); Chang-Jyun He, Taoyuan (TW); Yung-Fan Chu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 17/931,148

(22) Filed: Sep. 12, 2022

(65) Prior Publication Data

US 2023/0098042 A1  Mar. 30, 2023

Related U.S. Application Data

(60) Provisional application No. 63/245,231, filed on Sep. 17, 2021.

(51) Int. Cl.
*G01R 31/28* (2006.01)
*B65G 47/90* (2006.01)
(Continued)

(52) U.S. Cl.
CPC ............. *B65G 47/905* (2013.01); *G01N 3/04* (2013.01); *G01N 3/06* (2013.01); *G01N 3/12* (2013.01); *G01R 31/2867* (2013.01); *G01R 31/2874* (2013.01); *G01R 31/2887* (2013.01); *G01R 31/2893* (2013.01); *H01L 21/67333* (2013.01);
(Continued)

(58) Field of Classification Search
CPC ........ B65G 47/905; G01N 2203/0044; G01N 2203/0411; G01N 3/04; G01N 3/06; G01N 3/12; G01R 31/2867; G01R 31/2874; G01R 31/2887; G01R 31/2893; H01L 21/67236;
(Continued)

(56) References Cited

U.S. PATENT DOCUMENTS 4,881,591 A * 11/1989 Rignall ................. F27B 9/3077
165/206
5,414,370 A * 5/1995 Hashinaga ......... G01R 31/2849
324/762.01
(Continued)

*Primary Examiner* — Vinh P Nguyen
(74) *Attorney, Agent, or Firm* — McClure, Qualey & Rodack, LLP

(57) ABSTRACT

A temperature control system and method for devices under test and an image sensor-testing apparatus having the system are provided. The temperature control method for devices under test mainly comprises the steps of regulating the temperatures of a plurality of devices under test (DUTs) to a specific temperature in a temperature control zone; transferring the plurality of devices under test to a test plate and placing them into a plurality of test slots respectively; and measuring the temperatures of the device under test by the temperature-sensing elements in the test slots, wherein when at least one temperature-sensing element of the temperature-sensing elements detects that the device under test in the test slot corresponding to said at least one temperature-sensing element fails to meet the specific temperature, a temperature control element corresponding to the test slot regulates the temperature of the device under test.

6 Claims, 5 Drawing Sheets

(51) Int. Cl.
  *G01N 3/04* (2006.01)
  *G01N 3/06* (2006.01)
  *G01N 3/12* (2006.01)
  *H01L 21/673* (2006.01)
  *H05K 13/04* (2006.01)
(52) U.S. Cl.
  CPC . *H05K 13/0408* (2013.01); *G01N 2203/0044* (2013.01); *G01N 2203/0411* (2013.01)
(58) Field of Classification Search
  CPC .......... H01L 21/67333; H05K 13/0408; H05K 13/0434
  See application file for complete search history.

(56) References Cited

U.S. PATENT DOCUMENTS

| | | | | |
|---|---|---|---|---|
| 5,859,409 | A * | 1/1999 | Kim | G01R 31/2849 219/400 |
| 6,861,861 | B2 * | 3/2005 | Song | G01R 31/2877 324/750.08 |
| 8,008,934 | B2 * | 8/2011 | Wong | G01R 31/2849 324/750.08 |
| 9,285,393 | B2 * | 3/2016 | Kikuchi | G01R 31/01 |
| 11,680,980 | B2 * | 6/2023 | Tremmel | G01R 31/2862 324/750.05 |

* cited by examiner

TEMPERATURE CONTROL AND METHOD FOR DEVICES UNDER TEST AND IMAGE SENSOR-TESTING APPARATUS HAVING THE SYSTEM

FIELD OF THE INVENTION

The instant disclosure relates to a temperature control system and method for devices under test and an image sensor-testing apparatus having the system, particularly to a system and method for regulating the temperatures of electronic devices before and during execution of the test of the electronic devices and an image sensor-testing apparatus using the system or the method.

DESCRIPTION OF THE RELATED ART

In order to acquire the information of the operation states of electronic devices at high or low temperature, high and low temperature tests are performed before factory shipment or before the electronic devices are packaged. In the case of the high temperature test, the electronic devices are heated to a specific temperature, and then the test is initiated. Usually, the heating and the test of the electronic devices are carried out in a test station. However, in such a case, a testing module requires a long waiting time for heating the electronic devices. Moreover, dramatically and repeatedly heating and cooling the electronic devices in a testing apparatus would cause failure of a circuit or a mechanism of the testing apparatus and hence significantly affect the service life thereof.

In an alternative manner, the electronic devices are placed in a preheating zone and heated to a specific temperature, and then the electronic devices are transferred to a test station where the test of the electronic devices is executed. However, in such a case, accurately maintaining the temperature of each electronic device is difficult because the temperatures of some of the electronic devices may drop significantly during a batch transfer process or during a batch testing process, and this would affect the test accuracy.

Taiwanese Patent No. 1502206, entitled "Image-Sensing Electronic Device-Testing Device and Testing Apparatus Having the Same" discloses that a device under test (DUT) is transferred into a closed chamber, and the temperature of the device under test is regulated by feeding a temperature control fluid (cold source) into the closed chamber through a plurality of pipes. Moreover, an additional evacuation means must be provided to prevent dew condensation in the chamber.

As can be known from the above-mentioned prior art, a single testing device can only test a single one device under test and is unable to carry out a batch test, resulting in poor test efficiency. In addition, such a testing device has a complex structure, a large volume and high construction and maintenance costs. Therefore, a temperature control system method for devices under test and a testing apparatus capable of testing electronic devices in a batch and capable of performing temperature regulation or temperature compensation for individual electronic devices under test are highly expected in the industry and the public.

SUMMARY OF THE INVENTION

The main object of the instant disclosure is to provide a temperature control system and method for devices under test and an image sensor-testing apparatus having the system capable of testing a plurality of electronic devices under test, especially image sensors, in a batch and capable of performing temperature regulation or temperature compensation for individual electronic devices under test so that it can precisely regulate or maintain the temperature of each electronic device under test, thereby effectively improving the test accuracy and the test efficiency.

To achieve the above object, the instant disclosure provides a temperature control method for devices under test comprising the steps of: regulating temperatures of a plurality of devices under test (DUTs) to a specific temperature in a temperature control zone; transferring the plurality of devices under test to a test plate and placing the plurality of devices under test into a plurality of test slots respectively, the test plate including a plurality of temperature-sensing elements and a plurality of temperature control elements, each test slot being correspondingly provided with one temperature-sensing element and one temperature control element; and detecting the temperatures of the plurality of devices under test in the plurality of test slots by the plurality of temperature-sensing elements respectively, wherein when at least one temperature-sensing element of the temperature-sensing elements detects that the device under test in the test slot corresponding to said at least one temperature-sensing element fails to meet the specific temperature, the temperature control element corresponding to the test slot regulates the temperature of the device under test.

According to the method provided by the instant disclosure, the temperatures of the plurality of devices under test are regulated in a batch by means of the temperature control zone, thereby greatly saving the waiting time for heating or cooling the devices under test in the test plate and improving the test efficiency of the apparatus. Furthermore, before or during execution of the test, the temperature of each device under test can be detected individually. Once it is found that the temperature of one of the devices under test does not meet the preset specific temperature, said one of the devices under test can be independently temperature-compensated to maintain the temperature uniformity in the test temperatures of all the devices under test, thereby improving the test accuracy.

To achieve the above object, the instant disclosure provides a temperature control system for devices under test, which comprises a temperature control zone, a test plate, a plurality of temperature-sensing elements, a plurality of temperature control elements and a controller. The temperature control zone is used for regulating temperatures of a plurality of devices under test to a specific temperature; the test plate includes a plurality of test slots, which are used for accommodating the plurality of devices under test respectively; the plurality of temperature-sensing elements are disposed in the test plate corresponding to the plurality of test slots respectively for measuring the temperatures of the plurality of devices under test respectively; the plurality of temperature control elements are disposed in the test plate corresponding to the plurality of test slots respectively for regulating the temperatures of the plurality of devices under test respectively; the controller is electrically connected to the test plate, the plurality of temperature-sensing elements and the plurality of temperature control elements, wherein when at least one temperature-sensing element of the temperature-sensing elements detects that the device under test in the test slot corresponding to said at least one temperature-sensing element fails to meet the specific temperature, the controller controls the temperature control element corresponding to the test slot to regulate the temperature of the device under test.

In other words, according to the temperature control system for devices under test provided by the instant disclosure, the temperatures of the devices under test are regulated by means of the temperature control zone. When the temperatures of the devices under test approximate to, or are equal to or greater than the test temperature (specific temperature), the plurality of devices under test are transferred to the test plate in a batch, and the controller controls the plurality of temperature-sensing elements to detect the temperatures of the devices under test respectively. When the device under test fails to meet the test temperature, the controller controls the corresponding temperature control element to perform temperature compensation for the device under test failing to meet the test temperature, there by maintaining the temperatures of all of the devices under test at the test temperature so that no test error is caused due to temperature deviation. Because the temperatures of the devices under test have been regulated in the temperature control zone in advance, the temperatures of the devices under test do not greatly deviate from the test temperature when the devices under test are transferred to the test plate. If temperature compensation is required, the preset temperature can be reached quickly so that the waiting time of the testing apparatus can be reduced and the test efficiency can be improved.

To achieve the above object, the instant disclosure provides an image sensor-testing apparatus, which comprises the above-mentioned temperature control system for devices under test and a pressing head. The pressing head is electrically connected to the controller, and the controller controls the pressing head to selectively move to the test plate so as to press the devices under test or to move away from the test plate. The pressing head may include a plurality of light-emitting units and a plurality of light-guiding channels, the plurality of light-guiding channels are coupled with the plurality of light-emitting units respectively at one side and correspond to the plurality of test slots respectively at the other side. The pressing head may further include a negative pressure channel, one end of which is communicated with the plurality of light-guiding channels, and the other end of which is communicated with a negative pressure source. In this way, the plurality of light-guiding channels can not only be used for guiding light, but also for generating negative pressures to pick and place the devices under test.

Additionally, the temperature control system for devices under test of the instant disclosure may further include a plurality of pressing head temperature control units, which may be disposed in the pressing head and electrically connected to the controller; and the plurality of pressing head temperature control units correspond to the plurality of test slots respectively. Accordingly, when at least one temperature-sensing element of the plurality of temperature-sensing elements detects that the devices under test in the test slots corresponding to said at least one temperature-sensing element fails to meet a specific temperature, the controller can control the pressing head temperature control unit corresponding to the test slot to regulate the temperature of the devices under test. In other words, the instant disclosure can simultaneously use the temperature control elements in the test plate and the pressing head temperature control units in the pressing head to perform temperature compensation for the devices under test so as to create a complete temperature control environment so that the devices under test can be in a high-temperature or low-temperature temperature control environment, thereby accelerating heating or cooling of the devices under test and further improving the test efficiency.

DESCRIPTION OF THE PREFERRED EMBODIMENTS

Figure 1:
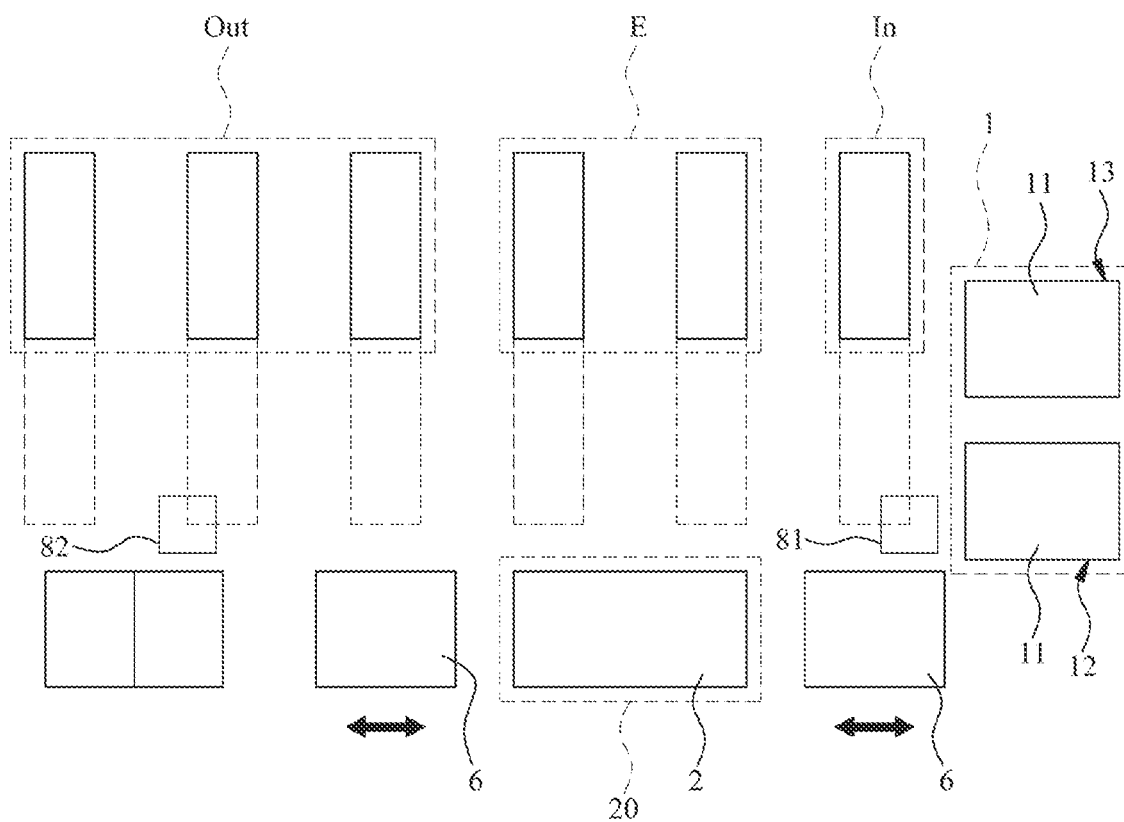
FIG. 1 is a schematic diagram of a preferred embodiment of a testing apparatus according to the instant disclosure showing the module deployment.

Before a temperature control system and method for devices under test and an image sensor-testing apparatus having the system according to the instant disclosure are described in detail in the embodiments, it should be noted that in the following description, similar components will be designated by the same reference numerals. Furthermore, the drawings of the instant disclosure are for illustrative purposes only, they are not necessarily drawn to scale, and not all details are necessarily shown in the drawings.

Figure 2:
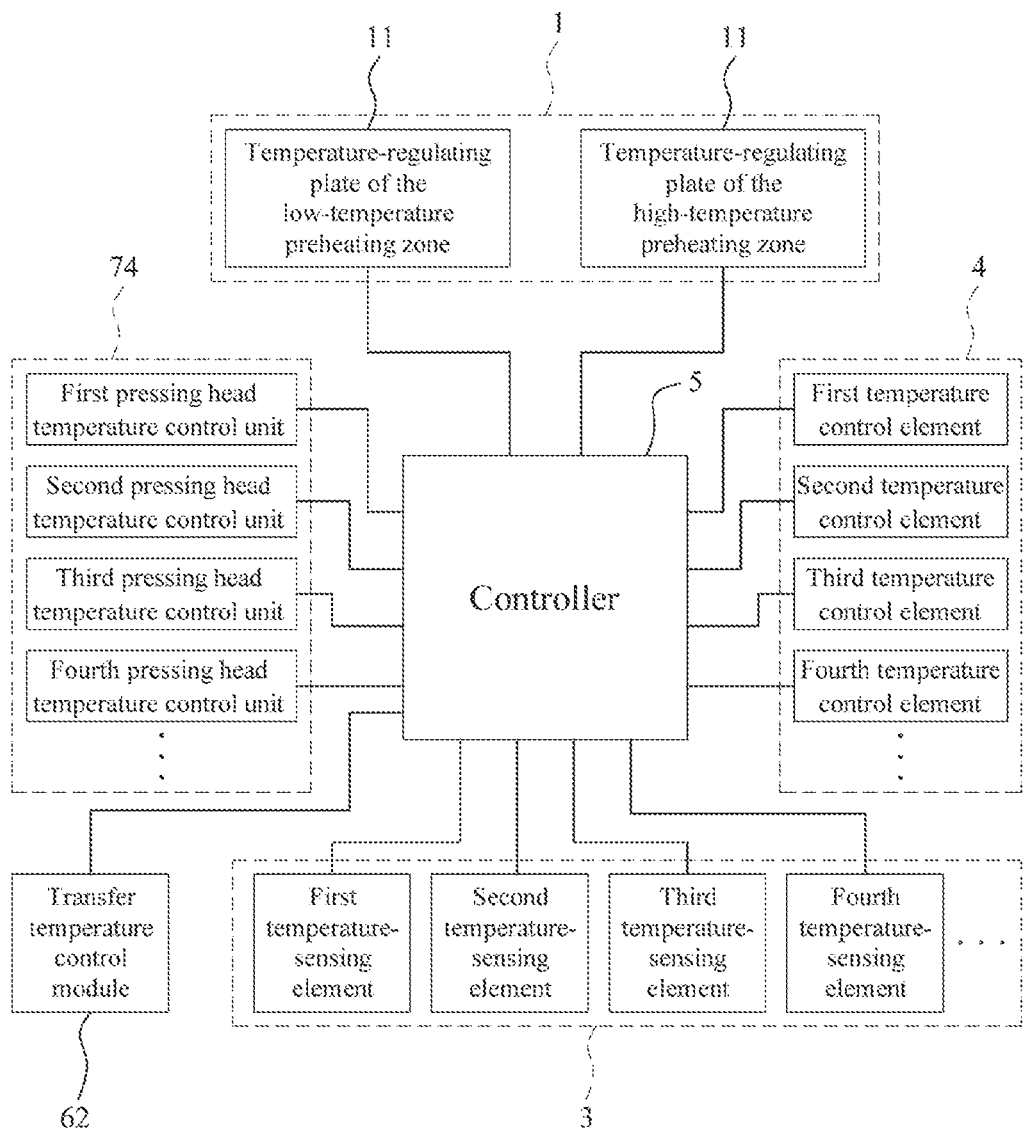
FIG. 2 is a system architecture diagram of a preferred embodiment of a temperature control system for devices under test according to the instant disclosure.

Reference is made to FIG. 1 and FIG. 2 at the same time. FIG. 1 is a schematic diagram of a preferred embodiment of a testing apparatus according to the instant disclosure showing the module deployment, and FIG. 2 is a system architecture diagram of a preferred embodiment of a temperature control system for devices under test according to the instant disclosure. In the embodiments, the instant disclosure is described in the case of an image sensor-testing apparatus. However, the instant disclosure is not limited to the image sensors-testing apparatus, and the instant disclosure can be applied to any testing apparatus that requires temperature control, such as a testing apparatus for executing a test at a high temperature or a low temperature.

As shown in FIG. 1, the testing apparatus of this embodiment mainly includes a feeding zone In, an empty tray zone E, a discharging zone Out, a temperature control zone 1, two DUT-transferring devices 6 and a testing zone 20. The feeding zone In is used to load devices under test (DUTs). The empty tray zone E is used to load empty chip trays. After the devices under test on a chip tray (not shown) in the feeding zone are picked up, the empty chip tray is transferred from the feeding zone In to the empty tray zone E. The discharging zone Out is used to load tested devices.

The temperature control zone 1 of this embodiment includes a low-temperature preheating zone 12 and a high-temperature preheating zone 13. Each of the low-temperature preheating zone 12 and the high-temperature preheating zone 13 of this embodiment includes a temperature-regulating plate 11. The temperature-regulating plate 11 of the low-temperature preheating zone 12 is provided for heating the devices under test to a first specific temperature (for example, 60° C.), and the temperature-regulating plate 11 of the high-temperature preheating zone 13 is provided for heating the devices under test to a second specific temperature (for example, 120° C.). It should be noted that, in this embodiment, the target temperature of the temperature-regulating plate 11 is usually greater than or equal to the specific temperature.

Figure 3:
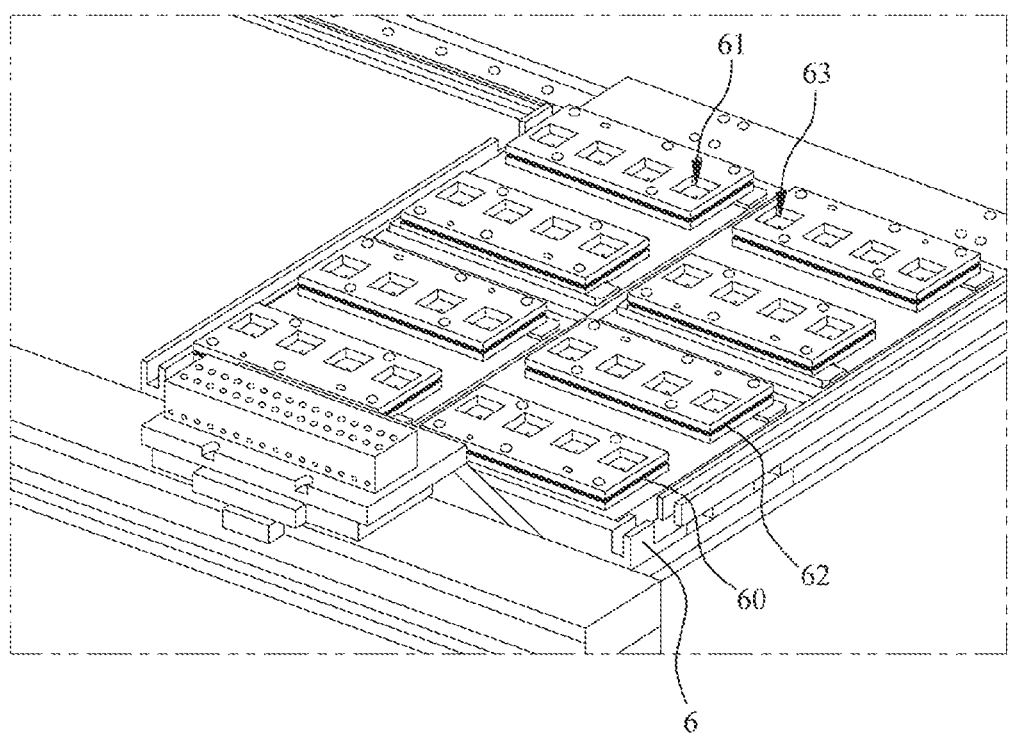
FIG. 3 is a perspective view of a preferred embodiment of a DUT-transferring device according to the instant disclosure.

Reference is made to FIG. 3, which is a perspective view of a preferred embodiment of a DUT-transferring device 6 according to the instant disclosure. Two DUT-transferring devices 6 are included in this embodiment, one of the DUT-transferring devices 6 is disposed on one side of the testing zone 20 for feeding the devices under test from the testing zone 20 to the testing zone 20, and the other of the DUT-transferring devices 6 is disposed on the other side of the testing zone 20 for discharging the tested devices from the testing zone 20 to the discharging zone Out. As shown in the figure, each DUT-transferring device 6 includes eight chip holders 60, and each chip holder 60 includes four chip slots 61. Consequently, the DUT-transferring device 6 of this embodiment is capable of transferring thirty-two devices under test in a batch at one time. Moreover, the chip holder 60 is provided with a transfer temperature control module 62 for heating, cooling the devices under test or maintaining the temperatures of the devices under test during a transfer process.

Figure 4:
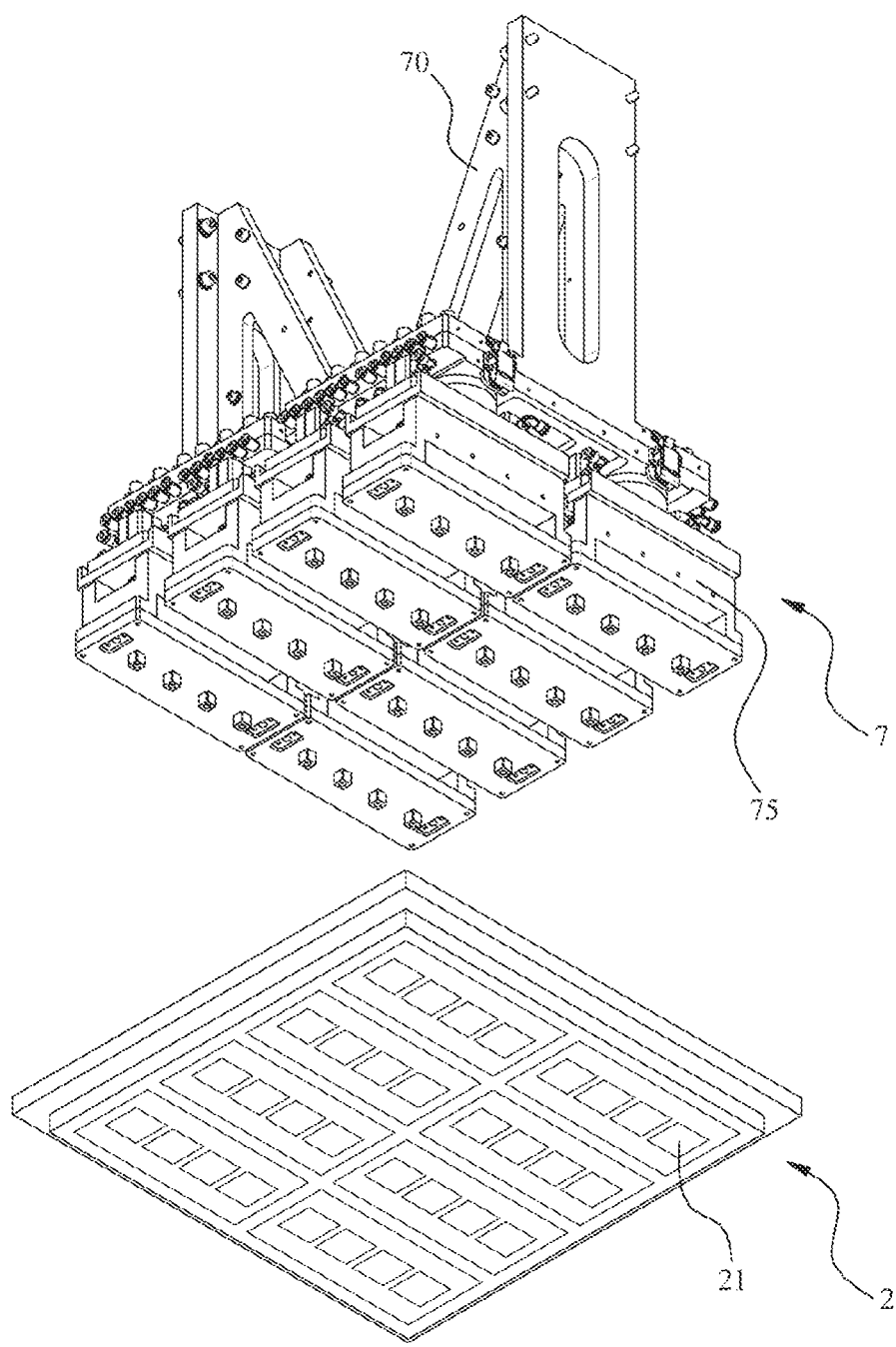
FIG. 4 is a perspective view of a preferred embodiment of a pressing head according to the instant disclosure.
Figure 5A:
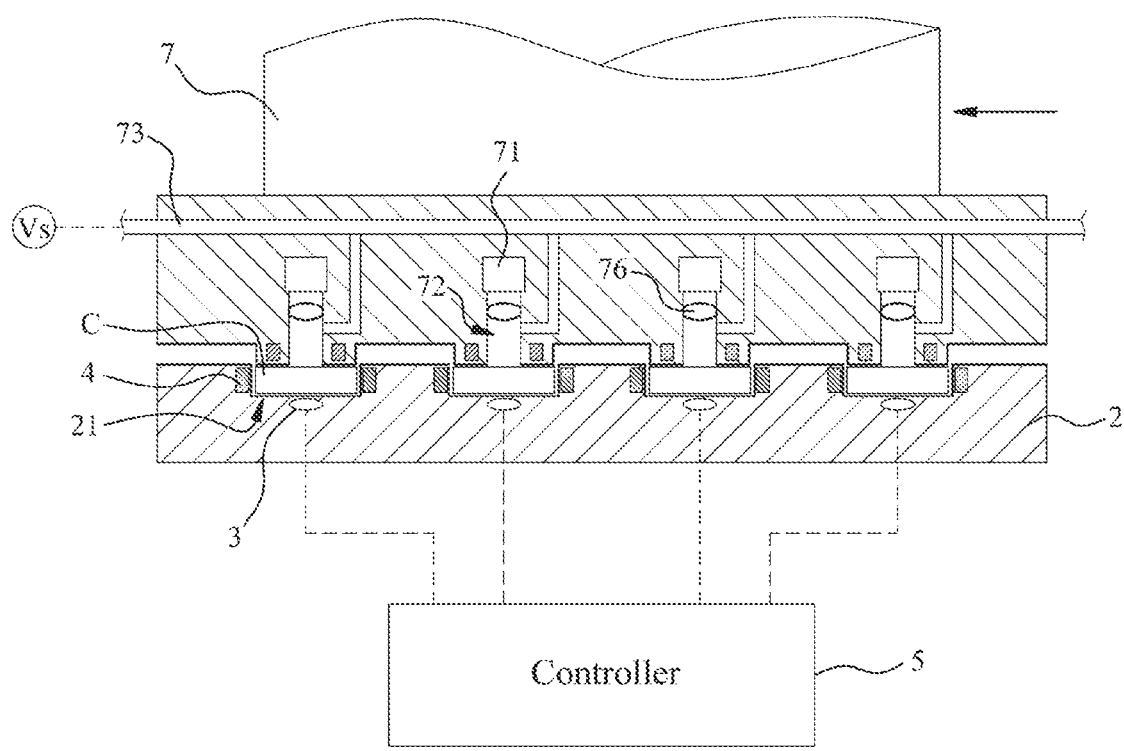
FIG. 5A is a schematic cross-sectional view of the pressing head and a test plate during execution of the test according to the instant disclosure.
Figure 5B:
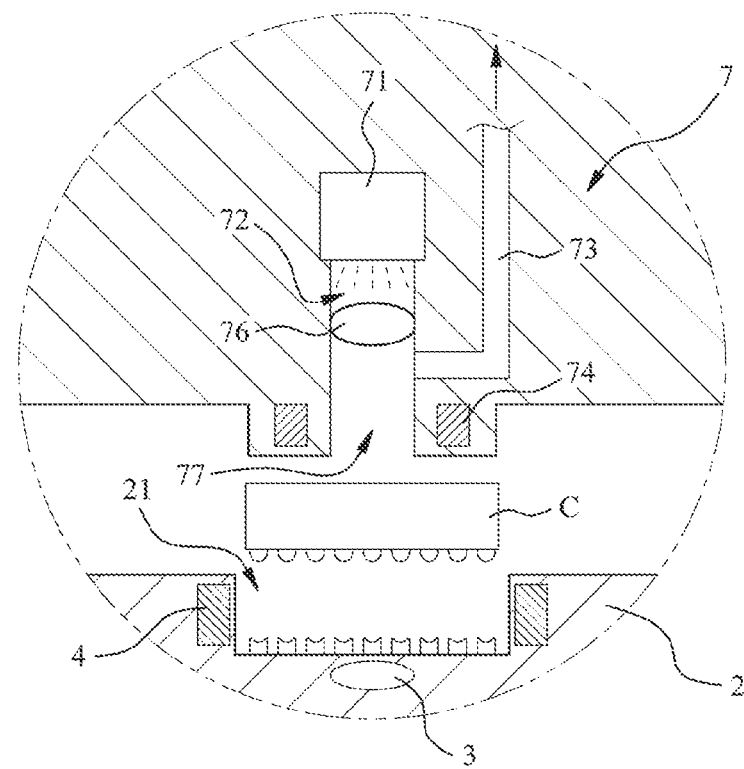
FIG. 5B is an exploded and enlarged cross-sectional view of the pressing head and the test plate during execution of the test according to the instant disclosure.

Reference is made to FIG. 4, FIG. 5A and FIG. 5B. FIG. 4 is a perspective view of a preferred embodiment of a pressing head according to the instant disclosure. FIG. 5A is a schematic cross-sectional view of the pressing head and a test plate upon execution of the test according to the instant disclosure. FIG. 5B is an exploded and enlarged cross-sectional view of the pressing head and the test plate upon execution of the test according to the instant disclosure. The testing zone 20 of this embodiment mainly includes a test plate 2 and a pressing head 7. The pressing head 7 is disposed above the test plate 2 and is controlled to move to the test plate 2 so as to press devices under test C or to move away from the test plate.

In this embodiment, the test plate 2 includes eight test sockets. Each test socket includes four test slots 21 for accommodating devices under test C, and each test slot 21 is correspondingly provided with a temperature-sensing element 3 and a temperature control element 4. The temperature-sensing element 3 is used for measuring the temperature of the device under test C, and the temperature control element 4 is used for regulating the temperature of the device under test C.

As shown in FIG. 2, this embodiment includes a controller 5. For example, the controller 5 may be digital systems or cloud platforms applied to a personal computer (PC), a notebook computer, an industrial computer (IPC), a cloud server, or the like, or software programs installed in the above computer device for users to operate the computer device so that the operation of the entire testing apparatus including temperature control can be automatically performed. In the present embodiment, the controller 5 is electrically connected to the temperature control zone 1, the test plate 2, the DUT-transferring devices 6, the pressing head 7, etc.

As shown in FIG. 4, FIG. 5A and FIG. 5B, the pressing head 7 of this embodiment includes a lifting arm 70 and eight pressing blocks 75. The eight pressing blocks 75 are mounted on the lifting arm 70, and the lifting arm 70 may be, for example, composed of a motor and a worm screw and can be controlled to be lowered so that the pressing blocks 75 is moved to the set socket 2 so as to press the devices under test C or to be lifted so that the pressing blocks 75 is moved away from the test plate 2. The pressing block 75 includes four light-emitting units 71 and four light-guiding channels 72, one end of each light-guiding channel 72 is communicated with one light-emitting unit 71, and the other end of each light-guiding channel 72 corresponds to one test slot 21. A lens unit 76 for light diffusion is provided in each light-guiding channel 72 so that the light emitted by the light-emitting unit 71 can be uniformly diffused in the light-guiding channel 72.

The pressing block 75 of this embodiment is internally provided with four pressing head temperature control units 74, which are electrically connected to the controller 5, and each pressing head temperature control unit 74 corresponds to one test slot 21. In this embodiment, each pressing block 75 is internally provided with a negative pressure channel 73, one end of which is communicated with the light-guiding channels 72, and the other end of which is communicated with a negative pressure source Vs. By means of the negative pressure channel 73, the light-guiding channel 72 can generate a negative pressure so that the opening 77 of the light-guiding channel 72 can suck the device under test C for picking and placing the device under test C.

The operation process and temperature control method for devices under test of the testing apparatus of this embodiment will be described below. Reference is made to FIG. 1 to FIG. 5B. First, the devices under test C located in the feeding zone In are transferred to the temperature control zone 1 and placed on the temperature-regulating plate 11 of the low-temperature preheating zone 12 by a feeding pick-and-place device 81. Next, after the temperatures of the devices under test C in the low-temperature preheating zone 12 are regulated to a specific temperature (for example, 60° C.), the feeding pick-and-place device 81 transfers the devices under test C to the DUT-transferring device 6, and then, the DUT-transferring device 6 moves the devices under test C into the testing zone 20.

It is noted that the DUT-transferring device 6 of the present embodiment can maintain the temperatures of the devices under test C or heat the devices under test C during the transfer process by the transfer temperature control module 62. The chip slot 61 is provided with a suction hole 63 (shown in FIG. 3), which is communicated with a negative pressure source (not shown) for sucking and holding the device under test C so as to prevent the device under test C from falling out from the chip slot 61 during the transfer process. In this embodiment, the chip slot 61 is further provided with a pressure-sensing element (not shown) which is used for detecting the pressure (negative pressure) in the chip slot 61 so as to determine whether the device under test C is properly placed into the chip slot 61. Once the pressure in the chip slot 61 is abnormal, it means that the device under test C is not properly placed into the chip slot 61. In this case, the controller 5 controls the feeding pick-and-place device 81 to pick and place the device under test C again.

After the DUT-transferring device 6 moves the devices under test C into the testing zone 20, the pressing head 7 is controlled to move to the DUT-transferring device 6 and to suck the devices under test C through the openings 77 of the light-guiding channels 72. After that, the DUT-transferring device 6 moves out of the testing zone, and the pressing head 7 is controlled to place the devices under test C into the test slots 21. At this time, the pressing blocks 75 keeps pressing the devices under test C.

Then, the temperature-sensing element 3 of each test slot 21 measures the temperature of the device under test C in the test slot and sends a measurement result back to the controller 5. When at least one temperature-sensing element of the temperature-sensing elements 3 detects that the device under test C in the test slot 21 corresponding to said at least one temperature-sensing element fails to meet the specific temperature, the controller 5 controls the temperature control element 4 and the pressing head temperature control unit 74 in the pressing block 75 which correspond to the test slot 21 to regulate the temperature of the device under test C (i.e., heat or cool the device under test C).

During this process, the temperature-sensing element 3 keeps measuring the temperature. When the measured temperature reaches the test temperature (the specific temperature), the controller disables the temperature control element 4 and the pressure head temperature control unit 74 and initiates the test.

Once the test is completed, the pressing head 7 directly sucks the devices under test C and is lifted. At this time, the other DUT-transferring device 6 moves into the testing zone 20, and the pressing head 7 is lowed and places the devices under test C into the DUT-transferring device 6. After that, the DUT-transferring device 6 moves out of the testing zone, and the discharging pick-and-place device 82 places the tested devices into the corresponding discharging zone Out according to the test result.

It should be noted that the temperature control elements, the temperature control units, the temperature control modules and the temperature-regulating plates mentioned in this embodiment may include, but are not limited to, electric heat generating units, pipeline modules for circulation of heading fluid and cooling fluid, thermoelectric cooling chips, or other equivalent elements, devices, or modules capable of thermal regulation.

As can be seen from the above, the present embodiment at least has the following unexpected effects:
1. The temperature control zone 1 is used to regulate the temperatures of the plurality of devices under test C in a batch, thereby greatly saving the waiting time for heating or cooling the devices under test in the test slots 21 and improving the test efficiency of the apparatus.
2. Thirty-two devices under test C can be transferred in a batch at one time by the DUT-transferring device 6, and during the transfer process, the transfer temperature control modules 62 are used to maintain the temperatures of the devices under test C or heat or cool the devices under test C.
3. Thirty-two devices under test C can be tested in a batch at one time. Moreover, the temperature of each device under test C can be individually detected before or during execution of the test. Once it is found that one or more devices under test C fail to meet the preset specific temperature, temperature compensation can be performed for the one or more devices under test C independently so as to uniformize the test temperature for all the devices under test C, thereby improving the test accuracy.
4. The device under test C that failing to meet the test temperature is regulated by the temperature control element 4 of the test slot 21 and the pressing head temperature control unit 74 of the pressing block 75 so that a complete temperature control environment can be created for accelerating heating or cooling of the he device under test C and hence for improving the test efficiency.
5. The light-guiding channel of the pressing head can also generate a negative pressure to suck, pick and place the device under test C.

The preferred embodiments of the instant disclosure are illustrative only, and the claimed inventions are not limited to the details disclosed in the drawings and the specification.

Accordingly, it is intended that it have the full scope permitted by the language of the following claims.

What is claimed is:

1. A temperature control method for devices under test, comprising the steps of:
   (A) regulating temperatures of a plurality of devices under test (DUTs) to a specific temperature in a temperature control zone;
   (B) transferring the plurality of devices under test to a test plate and placing the plurality of devices under test into a plurality of test slots respectively, the test plate including a plurality of temperature-sensing elements and a plurality of temperature control elements, each test slot being correspondingly provided with one temperature-sensing element and one temperature control element; and
   (C) measuring the temperatures of the plurality of devices under test in the plurality of test slots by the plurality of temperature-sensing elements respectively, wherein when at least one temperature-sensing element of the temperature-sensing elements detects that the device under test in the test slot corresponding to said at least one temperature-sensing element fails to meet the specific temperature, the temperature control element corresponding to the test slot regulates the temperature of the device under test;
   wherein in the step (B), the plurality of devices under test are transferred to the test plate by a DUT-transferring device, and the DUT-transferring device includes a transfer temperature control module, which is used for regulating or maintaining the temperatures of the devices under test.

2. A temperature control system for devices under test, comprising:
   a temperature control zone, which is used for regulating the temperatures of a plurality of devices under test to a specific temperature;
   a test plate, including a plurality of test slots for accommodating the plurality of devices under test respectively;
   a plurality of temperature-sensing elements, disposed in the test plate and corresponding to the plurality of test slots respectively, the plurality of temperature-sensing elements being used for measuring the temperatures of the plurality of devices under test respectively;
   a plurality of temperature control elements, disposed in the test plate and corresponding to the plurality of test slots respectively, the plurality of temperature control elements being used for regulating the temperatures of the plurality of devices under test respectively;
   a DUT-transferring device for transferring the plurality of devices under test from the temperature control zone to the test plate, the DUT-transferring device including a transfer temperature control module for regulating or maintaining the temperatures of the devices under test during a transfer process; and
   a controller, electrically connected to the test plate, the plurality of temperature-sensing elements, the DUT-transferring device, and the plurality of temperature control elements,
   wherein when at least one temperature-sensing element of the temperature-sensing elements detects that the device under test in the test slot corresponding to said at least one temperature-sensing element fails to meet the specific temperature, the controller controls the temperature control element corresponding to the test slot to regulate the temperature of the device under test.

3. An image sensor-testing apparatus, comprising:
the temperature control system for devices under test of claim 2; and
a pressing head, electrically connected to the controller, the controller controlling the pressing head to move to the test plate so as to press the plurality of devices under test or to move away from the test plate.

4. The image sensor-testing apparatus of claim 3, wherein the pressing head includes a plurality of light-emitting units and a plurality of light-guiding channels, one ends of the plurality of light-guiding channels communicate with the plurality of light-emitting units respectively, and the other ends of the plurality of light-guiding channels correspond to the plurality of test slots respectively.

5. The image sensor-testing apparatus of claim 4, wherein the pressing head further includes a negative pressure channel, one end of which communicates with the plurality of light-guiding channels, and the other end of which communicates with a negative pressure source.

6. The image sensor-testing apparatus of claim 3, wherein the temperature control system for devices under test further includes a plurality of pressing head temperature control units, which are disposed on the pressing head and electrically connected to the controller, the plurality of pressing head temperature control units respectively correspond to the plurality of test slots, and when at least one temperature-sensing element of the plurality of temperature-sensing elements detects that the device under test in the test slot corresponding to said at least one temperature-sensing element fails to meet the specific temperature, the controller controls the pressing head temperature control unit corresponding to the test slot to regulate the temperature of the device under test.

* * * * *